(12) United States Patent
Yang et al.

(10) Patent No.: US 7,858,873 B2
(45) Date of Patent: Dec. 28, 2010

(54) PHOTOVOLTAIC CELL AND PHOTOVOLTAIC MODULE EMPLOYING THE SAME

(75) Inventors: Mingju Yang, Yamatotakada (JP); Tohru Nunoi, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 1044 days.

(21) Appl. No.: 11/103,474

(22) Filed: Apr. 12, 2005

(65) Prior Publication Data
US 2005/0178431 A1 Aug. 18, 2005

Related U.S. Application Data

(63) Continuation-in-part of application No. PCT/JP03/013101, filed on Oct. 14, 2003.

(30) Foreign Application Priority Data

Oct. 15, 2002 (JP) .............................. 2002-300795

(51) Int. Cl.
*H01L 25/00* (2006.01)
(52) U.S. Cl. ..................... 136/243; 428/212
(58) Field of Classification Search ........................ None
See application file for complete search history.

(56) References Cited

U.S. PATENT DOCUMENTS

| | | | |
|---|---|---|---|
| 3,773,882 A | 11/1973 | Schrenk | |
| 5,094,788 A | 3/1992 | Schrenk et al. | |
| 5,230,746 A | 7/1993 | Wiedeman et al. | |
| 5,389,324 A | 2/1995 | Lewis et al. | |
| 5,882,774 A * | 3/1999 | Jonza et al. | ................. 428/212 |
| 6,215,060 B1 * | 4/2001 | Komori et al. | ............. 136/251 |
| 2002/0015836 A1 * | 2/2002 | Jonza et al. | ................. 428/216 |

FOREIGN PATENT DOCUMENTS

| | | |
|---|---|---|
| JP | 4-95901 | 3/1992 |
| JP | 5-206490 | 8/1993 |
| JP | 5-259495 | 10/1993 |
| JP | 09507308 A * | 7/1997 |
| JP | 10-107306 | 4/1998 |
| JP | 11-281816 | 10/1999 |
| WO | 99/39224 | 8/1999 |

OTHER PUBLICATIONS

Nagashima (JP 05-259495) Machine Translation, Oct. 1993.*
Kin-Shen (JP 09-507308) Machine Translation, Jul. 1997.*
English translation of the International Preliminary Examination Report mailed Apr. 21, 2005 in corresponding PCT Application No. PCT/JP2003/013101.

* cited by examiner

*Primary Examiner*—Alexa D Neckel
*Assistant Examiner*—Shannon Gardner
(74) *Attorney, Agent, or Firm*—Nixon & Vanderhye P.C.

(57) ABSTRACT

There is provided a photovoltaic cell, which comprises: a photo-electric conversion layer having a front surface and a rear surface, and a reflection layer provided on the rear surface of the photo-electric conversion layer, wherein the reflection layer includes plural types of transparent layers having different refractive indices and alternately stacked and, when light is incident from the front surface of the photo-electric conversion layer, reflects a part of the incident light having a predetermined wavelength back into the photo-electric conversion layer.

13 Claims, 5 Drawing Sheets

PHOTOVOLTAIC CELL AND PHOTOVOLTAIC MODULE EMPLOYING THE SAME

This application is a continuation-in-part of Application No. PCT/JP2003/013101, filed 14 Oct. 2003, which claims priority of Japanese Application No. JP 2002-300795, filed 15 Oct. 2002. The entire contents of each of these applications are incorporated herein by reference.

BACKGROUND

1. Field of the Technology

The disclosed technology relates to a photovoltaic cell and a photovoltaic module employing such photovoltaic cells and, more specifically, to a photovoltaic cell structure excellent in photo-electric conversion efficiency.

2. Description of the Related Art

As a conventional photovoltaic cell is known a photovoltaic cell which includes a light receiving surface electrode and a rear electrode provided on opposite sides of a silicon substrate having a pn junction, and a module thereof (see, for example, Japanese Unexamined Patent Publication No. HEI10-107306 (1998)).

In such conventional photovoltaic cell, a grid pattern (of a comb shape) which includes thin lines and thick lines intersecting each other is employed as the light receiving surface electrode for increasing a light receiving area as much as possible.

On the other hand, the rear electrode is an electrode formed by applying an electrode material paste mainly containing aluminum over the entire rear surface of the silicon substrate by printing and then firing the applied paste.

In the photovoltaic module, the photovoltaic cells are two-dimensionally arranged, connected in series with a light receiving surface electrode of one of each two adjacent photovoltaic cells being connected to a rear electrode of the other photovoltaic cell by a wiring material such as a copper ribbon, and properly sealed with a glass plate or a moisture-proof film.

In the field of the photovoltaic cells, the thickness of the silicon substrate has been reduced for reduction of production costs, and a silicon substrate having a reduced thickness on the order of 300 µm has been generally used.

For further reduction of the production costs, it is conceivable to further reduce the thickness of the silicon substrate. Where the thickness of the silicon substrate is reduced to about 250 µm or smaller, however, incident light of a long wavelength range is not sufficiently absorbed by the silicon substrate, thereby mostly reaching the rear surface of the silicon substrate.

The incident light of the long wavelength range reaching the rear surface of the silicon substrate is reflected on the rear electrode back into the silicon substrate.

Where the rear electrode is the electrode formed in the conventional manner by firing the electrode material paste mainly containing aluminum, however, the reflectivity thereof is merely about 70%.

Therefore, the reduction of the thickness of the silicon substrate reduces the production costs, but fails to provide a sufficient photo-electric conversion efficiency.

SUMMARY OF THE INVENTION

In view of the foregoing, an aspect of the technology disclosed herein provides a photovoltaic cell having an excellent photo-electric conversion efficiency even if its photo-electric conversion layer is thinly formed, and a photovoltaic module employing such photovoltaic cells.

According to an example embodiment, there is provided a photovoltaic cell which includes a photo-electric conversion layer having a front surface and a rear surface, and a reflection layer provided on the rear surface of the photo-electric conversion layer, wherein the reflection layer includes plural types of transparent layers having different refractive indices and alternately stacked and, when light is incident from the front surface of the photo-electric conversion layer, reflects a part of the incident light having a predetermined wavelength back into the photo-electric conversion layer.

According to an example embodiment, a rear electrode and the reflection layer are provided on the rear surface of the photo-electric conversion layer, and the reflection layer reflects light having the predetermined wavelength out of the light incident from the front surface of the photo-electric conversion layer back into the photo-electric conversion layer.

Where the light of the predetermined wavelength to be reflected on the reflection layer is long wavelength light, the photovoltaic cell has an excellent photo-electric conversion efficiency even if the photo-electric conversion layer has a reduced thickness.

The reflection layer may be composed of an organic material, and include 50 to 500 transparent layers each having a thickness of 50 nm to 160 nm and including transparent layers of a first material having a refractive index of 1.45 to 1.65 and transparent layers of a second material having a refractive index of 1.70 to 1.90 which are alternately stacked.

The organic material for the reflection layer may be an organic polymer material.

The wavelength of the light to be reflected on the reflection layer may be 800 nm to 1100 nm.

The rear electrode may be provided locally on the rear surface of the photo-electric conversion layer.

The rear electrode may be provided locally on the rear surface of the photo-electric conversion layer, and an area ratio of the rear electrode to the rear surface of the photo-electric conversion layer may be 1% to 20%. The photo-electric conversion layer may comprise a silicon substrate including a pn junction layer and having a thickness of 100 µm to 250 µm.

According to another aspect of the present invention, there is provided a photovoltaic module which includes a plurality of photovoltaic cells two-dimensionally arranged, and a connection member which connects each two adjacent photovoltaic cells in series, wherein the photovoltaic cells each comprise the inventive photovoltaic cell.

DETAILED DESCRIPTION

A photovoltaic cell according to an example embodiment includes a photo-electric conversion layer, and a reflection layer provided on a rear surface of the photo-electric conversion layer. The reflection layer includes plural types of transparent layers having different refractive indices and alternately stacked, and is configured to reflect light having a predetermined wavelength out of light incident from a front surface of the photo-electric conversion layer back into the photo-electric conversion layer.

In an example photovoltaic cell, a silicon substrate including a pn junction layer and having a thickness of about 100 μm to about 250 μm, for example, is employed as the photo-electric conversion layer.

Here, a thickness of the silicon substrate of about 100 μm to about 250 μm is preferred for reducing production costs and ensuring a sufficient strength of the silicon substrate. That is, a thickness of the silicon substrate of greater than 250 μm is not effective for the reduction of the production costs. If the thickness of the silicon substrate is smaller than 100 μm, the mechanical strength of the substrate is too low. As a result, the substrate is liable to be cracked or chipped during production of the photovoltaic cell, thereby reducing the yield.

Where such a thin silicon substrate is employed, a loss of long wavelength light having a wavelength of 800 nm to 1100 nm out of the incident light is increased, thereby reducing the photo-electric conversion efficiency of the photovoltaic cell.

This is because short wavelength light is mostly absorbed by a subsurface portion of the silicon substrate and hence does not reach the rear surface of the silicon substrate even if the silicon substrate is thin, but long wavelength light having a wavelength of 800 nm to 1100 nm is not sufficiently absorbed by the thin silicon substrate thereby to reach the rear surface of the silicon substrate.

In this example photovoltaic cell, the reflection layer provided on the rear surface of the photo-electric conversion layer has a high reflectivity on the order of about 80% to 100% with respect to the long wavelength light having a wavelength of about 800 nm to about 1100 nm.

Particularly in the case of the silicon photovoltaic cell, a spectral sensitivity to light of a wavelength range of about 1100 nm to about 1200 nm is low. Therefore, it is important to increase at least a reflectivity with respect to light of a wavelength range of about 800 nm to about 1100 nm.

In this photovoltaic cell embodiment, the reflection layer is provided, for example, by alternately stacking transparent layers each having a refractive index of 1.45 to 1.65 and transparent layers each having a refractive index of 1.70 to 1.90.

In the combination of the two types of transparent layers, a difference in refractive index between each two adjacent transparent layers is preferably about 0.25 to about 0.45, more preferably about 0.3 to about 0.4.

The total number of the transparent layers may be about 50 to about 500.

The transparent layers may each be, for example, a layer of an organic polymer material having a thickness of 50 nm to 160 nm.

Specific examples of the organic polymer material include a polyester resin, a naphthol resin, a phenol resin, a Bakelite resin and a furan resin. The polyester resin and the furan resin are particularly preferred.

An example of the usable polyester resin is a copolymer of ethylene glycol and 2,3-naphthalenedicarboxylic acid $(C_{10}H_6(COOH)_2)$ which contains a polycyclic aromatic component such as a naphthalene ring.

Examples of the usable furan resin include polyvinylfuran and poly(2-vinyltetrahydrofuran).

Besides the organic polymer material, an inorganic material such as glass may be used, but the organic polymer material is preferred from the viewpoint of reflection characteristics and production costs.

Methods and apparatuses described in U.S. Pat. Nos. 3,773,882, 3,884,606, 5,389,324 and 5,094,788 may be employed for formation of the reflection layer having a multi-layer structure.

Co-extrusion methods such as described in U.S. Pat. Nos. 3,773,882 and 3,884,606 which utilize the thermoplastic property of a resin, for example, may be used as the principle of the formation.

A multi-layer film formation apparatus such as described in U.S. Pat. No. 5,389,324 may be used as an apparatus for the formation.

The multi-layer film formed by using such an apparatus may be divided into a plurality of multi-layer film segments, which are in turn stacked, and this process is repeated to provide a reflection film having a multi-layer structure including several hundred layers as described in U.S. Pat. No. 5,094,788.

A selective reflectivity at which light of a predetermined wavelength range is selectively reflected on a reflection film of a multi-layer structure is calculated from the following equations (1) to (3) described in O. S. Heavens, "Optical Properties of Thin Solid Films", Butterworths Science (1955). The equations (1) to (3) allows for calculation of the reflectivity $R(\lambda)$ of the multi-layer film observed when the light is incident perpendicularly to the film.

$$R_{(\lambda)} = \left|\frac{A_{(\lambda)}}{B_{(\lambda)}}\right|^2 \tag{1}$$

$$A(\lambda) = \eta_0(m_{11} + \eta_{l+1}m_{11}) - (m_{21} + \eta_{l+1}m_{22})$$

$$B(\lambda) = \eta_0(m_{11} + \eta_{l+1}m_{11}) + (m_{21} + \eta_{l+1}m_{22})$$

$$M = \prod_{j=1}^{l} M_j = \begin{vmatrix} m_{11} & m_{12} \\ m_{21} & m_{22} \end{vmatrix} \tag{2}$$

$$M_j = \begin{vmatrix} \cos\delta_j & i\eta_j^{-1}\sin\delta_j \\ i\eta_j\sin\delta_j & \cos\delta_j \end{vmatrix} \tag{3}$$

wherein $M_j$ is a characteristic matrix of a homogeneous j-th monolayer, M is a characteristic matrix of a homogeneous multilayer film, $m_{11}$, $m_{12}$, $m_{21}$, $m_{22}$ are diagonal elements of a product matrix of the characteristic matrices for the respective layers, $\eta_0$, $\eta_{l+1}$ and $\eta_j$ are effective refractive indices of a medium on an incident side, silicon and the j-th layer, which may be replaced with a complex refraction index $N_j = n_j - iK_j$ ($n_j$ is a principal refraction index, i is an imaginary unit, and $K_j$ is an extinction coefficient) for an absorptive medium, and $\delta_j = (2\pi/\lambda)N_jd_j$ ($d_j$ is the thickness of the j-th layer, and $\lambda$ is the wavelength of the incident light).

In the photovoltaic cell embodiment, the photo-electric conversion layer may include a light receiving surface electrode provided on a light receiving surface thereof. In this case, the light receiving surface electrode may be a comb-shaped electrode formed, for example, by applying an electrode material paste mainly containing silver or aluminum by printing and firing the applied paste.

In the photovoltaic cell, the photo-electric conversion layer preferably includes a rear electrode provided locally on the rear surface thereof, and the reflection layer is preferably provided over the entire rear surface of the photo-electric conversion layer.

The reflection layer serves to reflect the light reaching the rear surface of the photo-electric conversion layer as described above. Therefore, it is necessary to reduce the area ratio of the rear electrode to the rear surface of the photo-electric conversion layer and correspondingly increase the area ratio of the reflection layer to the rear surface.

From this viewpoint, the area ratio of the rear electrode to the rear surface of the photo-electric conversion layer is preferably about 1% to about 20%.

If the area ratio of the rear electrode is smaller than about 1%, there is a concern that the electrical resistance is excessively high, thereby reducing the photo-electric conversion efficiency.

On the other hand, if the area ratio is greater than about 20%, there is a concern that the area ratio of the reflection layer is correspondingly reduced, making it difficult to sufficiently reflect the long wavelength light having a wavelength of about 800 nm to about 1100 nm, and thereby reducing the photo-electric conversion efficiency.

Of course, the thickness of the rear electrode should be determined according to the area ratio.

The rear electrode is formed, for example, by applying an electrode material paste mainly containing silver or aluminum by printing and firing the applied paste. Besides, silver or an electrically conductive transparent material such as ITO (indium tin oxide), $SnO_2$ (tin oxide) or ZnO may be used.

The rear electrode may have any desired configuration. Where aluminum or silver is employed as described above, the rear electrode may have, for example, a comb shape.

Where the electrically conductive transparent material is employed, there is no concern that the rear electrode blocks the light incident on the reflection layer, obviating the need for the local provision of the rear electrode. Therefore, the rear electrode may cover the entire rear surface of the photo-electric conversion layer.

Where the formation of the rear electrode is achieved by printing the electrode material paste mainly containing aluminum on the entire rear surface of the silicon substrate and firing the applied paste as in the prior art, the photovoltaic cell is liable to be warped. This phenomenon becomes more remarkable as the thickness of the silicon substrate is reduced.

Where the rear electrode is provided locally on the rear surface of the photo-electric conversion layer in the photovoltaic cell, however, the warp of the photovoltaic cell may be suppressed which may otherwise occur during the formation of the rear electrode.

According to another aspect of the present invention, there is provided a photovoltaic module which includes a plurality of photovoltaic cells two-dimensionally arranged and a connection member which connects each two adjacent photovoltaic cells in series, wherein the photovoltaic cells each comprise the photovoltaic cell embodiment described above.

Where the rear electrode of each of the photovoltaic cells is provided locally on the rear surface of the photo-electric conversion layer as described above, the warp of the photovoltaic cells is suppressed, so that the photovoltaic cells can be easily connected in series to form a module.

With reference to the drawings, the photovoltaic cell embodiments will hereinafter be described in detail by way of embodiments thereof. In the following embodiments, like components will be denoted by like reference characters.

FIRST EMBODIMENT

Figure 1:
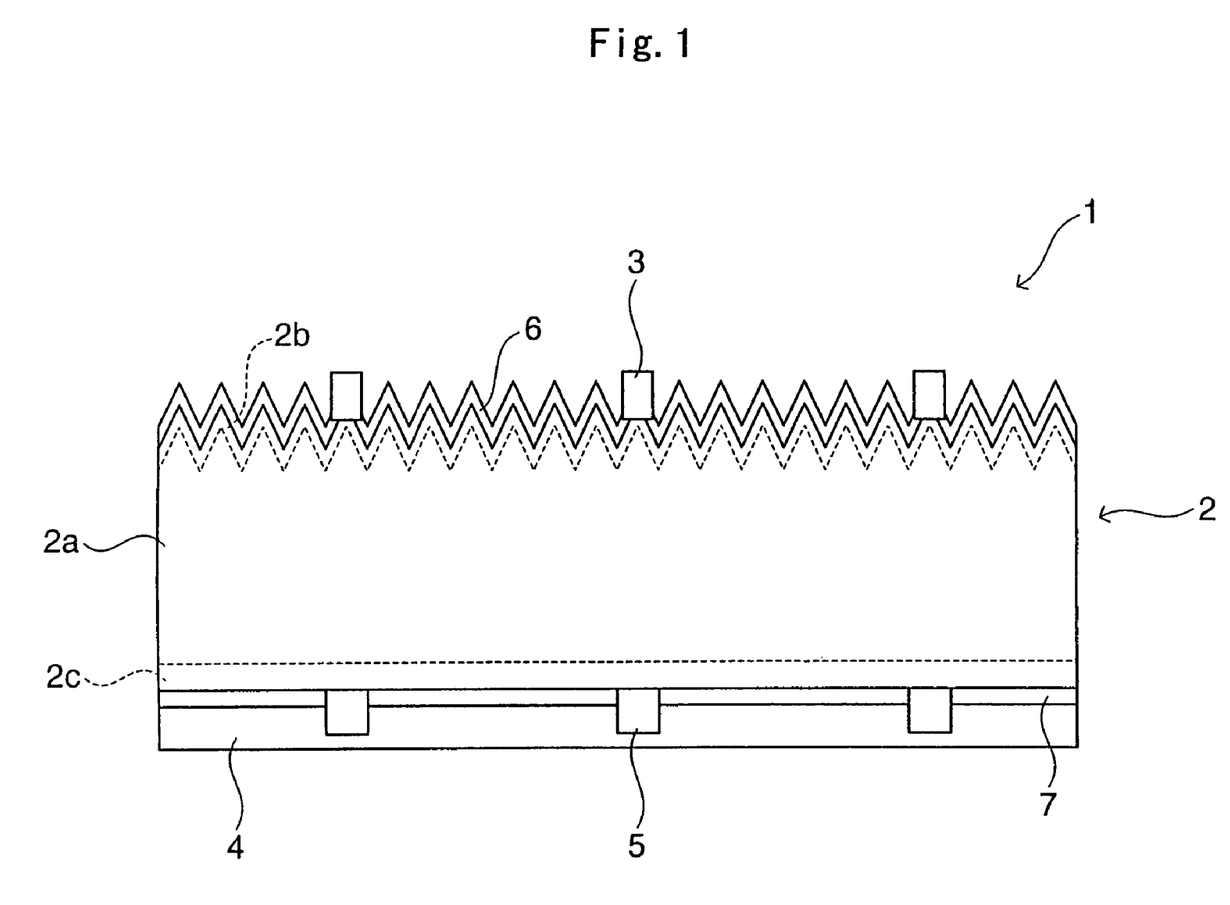
FIG. 1 is a sectional view schematically illustrating the construction of a photovoltaic cell according to a first example embodiment.

FIG. 1 is a sectional view schematically illustrating the construction of a silicon photovoltaic cell according to a first example embodiment.

As shown in FIG. 1, the photovoltaic cell 1 according to first embodiment includes a photo-electric conversion layer 2, a light receiving surface electrode 3 provided on a front surface of the photo-electric conversion layer 2, and a rear electrode 5 and a reflection film (reflection layer) 4 provided on a rear surface of the photo-electric conversion layer 2. The reflection film 4 includes plural types of transparent layers having different refractive indices and alternately stacked, and is configured to reflect long wavelength light out of light incident from the front surface of the photo-electric conversion layer 2 back into the photo-electric conversion layer 2.

The photo-electric conversion layer 2 includes a polycrystalline p-type silicon substrate 2a having a thickness of about 250 μm, and an $n^+$ diffusion layer 2b and a $p^+$ diffusion layer 2c respectively provided in a light receiving surface and a rear surface of the substrate 2a.

Further, a reflection prevention film 6 is provided on the light receiving surface of the photo-electric conversion layer 2, and a passivation layer 7 is provided between the photo-electric conversion layer 2 and the reflection film 4 as covering the rear surface of the photo-electric conversion layer 2.

A process sequence for producing the photovoltaic cell 1 according to first embodiment will hereinafter be described.

First, a polycrystalline p-type silicon substrate 2a having a size of about 15 cm×about 15 cm (length×width), a thickness of about 250 μm and a resistivity of about 1 Ω·cm is cleaned in a known manner, and a surface layer of the substrate fractured during slicing is removed by immersing the substrate in a solution mixture containing hydrofluoric acid (50%) and nitric acid in a volume ratio of 1:3 for about 1 minute.

Next, an impurity is diffused into the substrate in a heat treatment furnace at about 950° C. for about 20 minutes with the use of a $BBr_3$ diffusion source, whereby a $p^+$ diffusion layer 2c having a sheet resistance of about 50 Ω/□ and a thickness of about 0.4 μm is formed.

Thereafter, an ambient gas is switched to oxygen, and a passivation layer 7 of BSG (boron glass) having a thickness of about 150 nm is formed on the rear surface of the substrate 2a.

Then, an acid resistant tape is applied on the passivation layer 7, and a portion of the P+ diffusion layer formed on side faces and a light receiving surface of the substrate 2a is removed by immersing the substrate in the solution mixture of hydrofluoric acid and nitric acid.

Subsequently, an pyramid texture is formed on the light receiving surface of the substrate 2a by etching the light receiving surface with sodium hydroxide to provide a light confining effect in the light receiving surface of the substrate 2a.

Then, sodium hydroxide remaining on the substrate 2a is washed away with a hydrochloric acid aqueous solution, and an $SiO_2$ coating agent for semiconductor is applied on the $p^+$ diffusion layer 2c and dried, and heated up to about 500° C. so as to be tighten.

Thereafter, diffusion of phosphorus is carried out in a $POCl_3$ containing atmosphere in an electric furnace at about 860° C. for about 25 minutes.

Subsequently, a PSG (phosphorus glass) layer formed on the light receiving surface by the phosphorus diffusion and the coating agent on the rear surface are removed with the use of an HF containing solution, whereby an $n^+$ diffusion layer 2b having a surface concentration of about $10^{19}$ cm$^{-3}$ or greater and a thickness of about 0.3 μm is formed in the light receiving surface of the substrate 2a.

Thereafter, a reflection prevention film 6 of $SiN_x$ having a thickness of about 700 Å is formed on the $n^+$ diffusion layer 2b by a plasma CVD method using silane and ammonia as material gases.

The reflection prevention film 6 may be formed of $TiO_x$ or $SiO_x$, but is preferably formed of $SiN_x$ in consideration of a passivation effect provided by a hydrogen treatment.

Thereafter, an electrode material paste containing Ag powder is applied in comb-shaped grid patterns on the reflection prevention film 6 and the passivation layer 7 by screen printing, then dried, and fired in a near infrared oven at about 650° C., whereby the light receiving surface electrode 3 and the rear electrode 5 are formed.

It is noted that the electrode material printed on the reflection prevention film 6 and the passivation layer 7 penetrates into the reflection prevention film 6 and the passivation layer 7 during the firing. As a result, the light receiving surface electrode 3 and the rear electrode 5 thus formed respectively contact the $n^+$ diffusion layer 2b and the $p^+$ diffusion layer 2c.

The area ratio of the rear electrode 5 to the rear surface of the substrate 2a is about 10%.

Thereafter, a reflection film 4 is bonded to the passivation layer 7 as covering the rear electrode 5, whereby the photovoltaic cell 1 is completed. The bonding method is described below in detail.

A 14.6 cm square reflection film 4 is employed for the 15 cm square photovoltaic cell. The reflection film is bonded onto the photovoltaic cell with a 0.2 cm wide margin of the photovoltaic cell left uncovered while being substantially centered with the rear surface of the photovoltaic cell. Since the reflection film has a viscous surface protection film on its surface in contact with the rear surface of the photovoltaic cell, the reflection film 4 is pressed against the rear surface of the photovoltaic cell (for degassing) to be firmly bonded onto the rear surface in the bonding operation.

Figure 4:
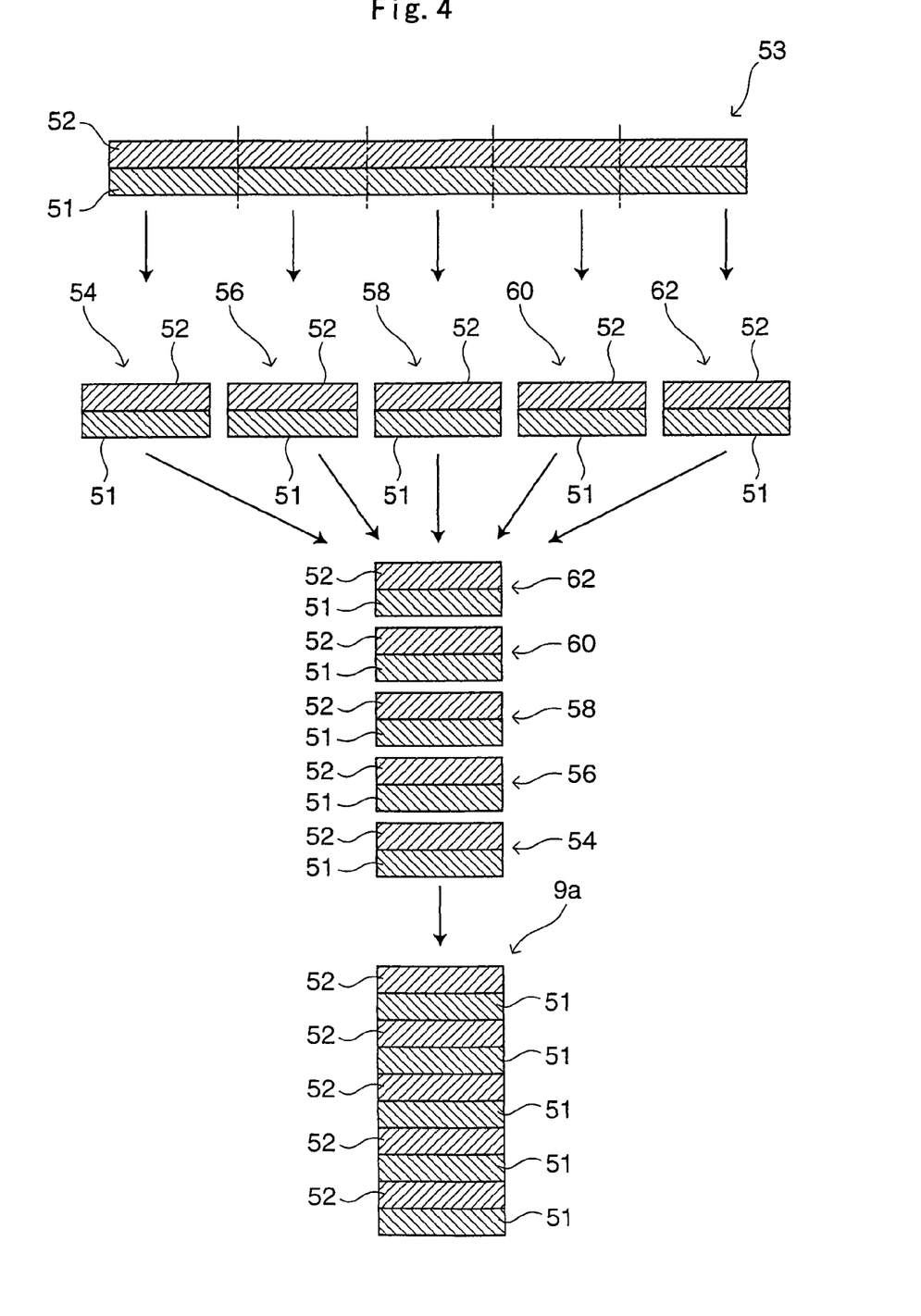
FIG. 4 is an explanatory diagram illustrating a method for forming the reflection layer.
Figure 5:
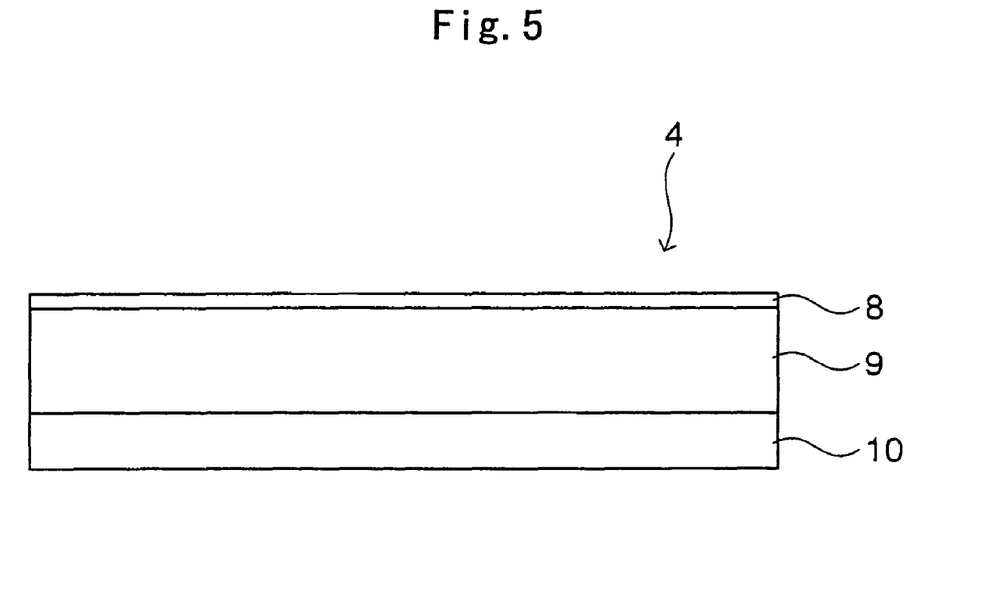
FIG. 5 is an explanatory diagram schematically illustrating the sectional construction of the reflection layer provided in the photovoltaic cell shown in FIG. 1.

As shown in FIG. 5, the reflection film 4 generally has a triple-layer structure including a surface protection film 8, a multi-layer reflection film 9 and a rear surface protection film 10. The multi-layer reflection film 9, which has a high reflection characteristic, includes two types of transparent layers 51, 52 (see FIG. 4) having different refractive indices and alternately stacked, and the total number of these transparent layers 51, 52 is 500.

Of the two types of transparent layers 51, 52, the transparent layers 51 are each composed of poly(2-vinyltetrahydrofuran) (hereinafter referred to as "first material"), and each have a refractive index of about 1.55 and a thickness of about 145 nm.

On the other hand, the transparent layers 52 are each composed of a copolymer of 2,3-naphthalenedicarboxylic acid ($C_{10}H_6(COOH)_2$) and ethylene glycol (hereinafter referred to as "second material"), and each have a refractive index of about 1.88 and a thickness of about 120 nm.

A method for forming the reflection film 4 will hereinafter be described with reference to FIGS. 4 and 5.

As shown in FIG. 4, a film 53 is first formed which has a double layer structure including a transparent layer 51 of the first material and a transparent layer 52 of the second material.

More specifically, a production apparatus as described in U.S. Pat. No. 5,389,324 can be employed, and the transparent layer 51 of the first material and the transparent layer 52 of the second material are each prepared in a sheet form while being passed through a feed-block of the apparatus to control the thickness thereof. Then, the transparent layer 51 and the transparent layer 52 thus prepared are combined together and extracted, whereby the film 53 of the double layer structure including the transparent layers 51, 52 having different refractive indices is formed.

Next, the film 53 of the double layer structure thus formed is divided into five segments 54, 56, 58, 60, 62, which can be stacked by a method as described in U.S. Pat. No. 5,094,788.

Subsequently, the segments 54, 56, 58, 60, 62 thus stacked are lapped to form a multi-layer reflection film 9a of a ten layer structure by a lapping apparatus as described in U.S. Pat. No. 5,094,788.

Though not shown, the multi-layer reflection film 9a thus formed is thereafter further divided, followed by stacking and lapping in the same manner as the formation of the multi-layer reflection film 9a described above, and this process is repeated to form a multi-layer reflection film 9 (see FIG. 5) including 500 transparent layers.

Then, a surface protection layer 8 and a rear surface protection layer 10 are formed by using the same apparatus as used for the formation of the transparent layers 51, 52, and respectively bonded to front and rear surfaces of the multi-layer reflection film 9, whereby a reflection film 4 having a sectional structure shown in FIG. 5 is provided.

Figure 3:
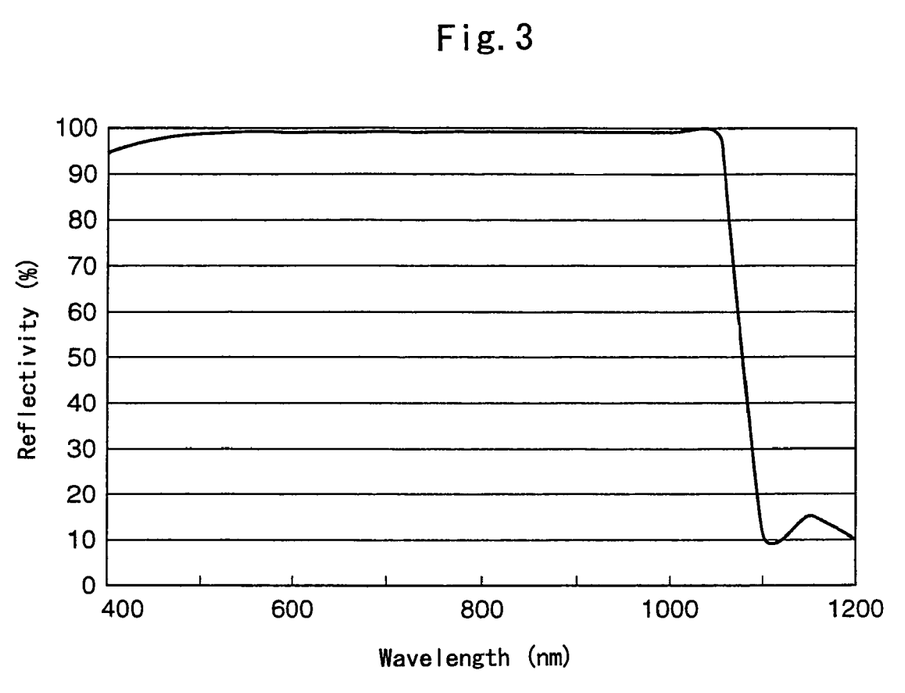
FIG. 3 is a graph illustrating a reflection characteristic of a reflection layer provided in the photovoltaic cell shown in FIG. 1.

The reflection film 4 thus produced has a reflection characteristic as shown in FIG. 3, and has a reflectivity of not smaller than about 95% with respect to light of a wavelength range of about 400 nm to about 1100 nm.

FIRST COMPARATIVE EMBODIMENT

For comparison with the photovoltaic cell of first embodiment, a photovoltaic cell (not shown) of first comparative embodiment is produced.

The photovoltaic cell of first comparative embodiment is different from the photovoltaic cell of first embodiment only in that the rear electrode is formed on the entire rear surface of the photo-electric conversion layer 2 by printing and firing of an aluminum paste and the reflection film is not provided.

When the photo-electric conversion efficiencies of the photovoltaic cell 1 of first embodiment and the photovoltaic cell of first comparative embodiment are measured under the same conditions, the photovoltaic cell 1 of first embodiment has a photo-electric conversion efficiency of about 17.5% and the photovoltaic cell of first comparative embodiment has a photo-electric conversion efficiency of about 14.6%.

The photovltaic cell 1 (15 cm×15 cm) of first embodiment has a warpage of about 2 mm or smaller, while the photovoltaic cell of first comparative embodiment has a warpage of about 4 mm.

Even if a thin silicon substrate having a thickness of about 250 μm is employed, the photo-electric conversion efficiency can be improved by providing the reflection film on the rear surface of the silicon substrate to increase the reflectivity with respect to the long wavelength light. Further, the warp of the substrate can be suppressed by providing the rear electrode 5 locally on the substrate.

SECOND EMBODIMENT

Figure 2:
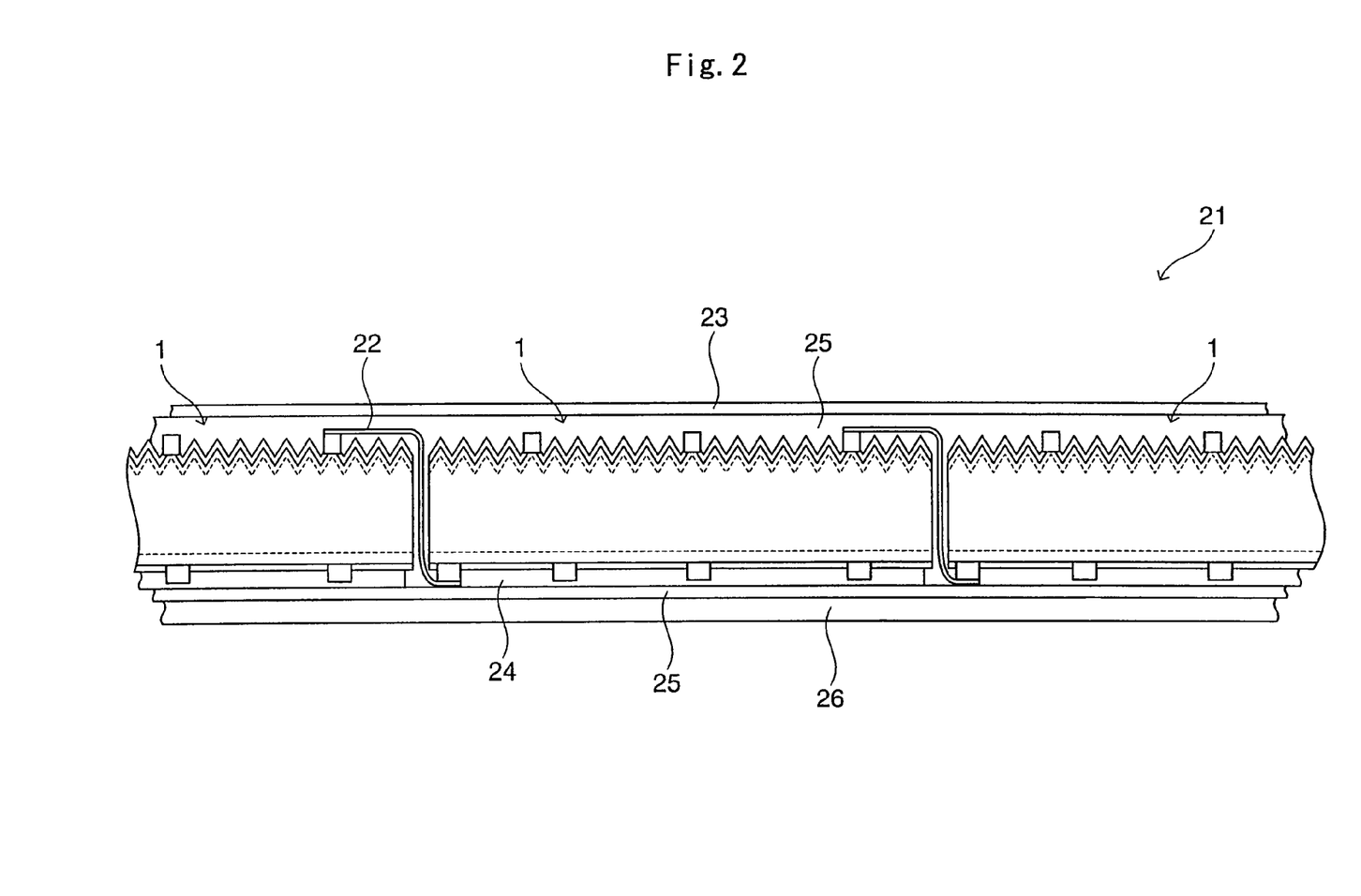
FIG. 2 is a sectional view schematically illustrating the construction of a photovoltaic module according to a second example embodiment.

FIG. 2 is a sectional view schematically illustrating the construction of a photovoltaic module according to second embodiment of the present invention.

In the photovoltaic module 21 of second embodiment, as shown in FIG. 2, photovoltaic cells 1 of first embodiment (see FIG. 1) described above are two-dimensionally arranged, and connected in series with a front surface electrode of one of each two adjacent photovoltaic cells connected to a rear electrode of the other photovoltaic cell by a connection member 22.

Though not shown, the photovoltaic module 21 includes 40 photovoltaic cells 1 which are arranged in four columns and ten rows and connected in series. An aluminum wire is used as the connection member 22. A reflection film 24 trimmed away from connection electrode pads is bonded to a rear surface of each of the photovoltaic cells 1. A resin sheet 25 of EVA, the photovoltaic cells connected in series, a resin sheet 25 of EVA and a rear surface protection sheet 26 are stacked in this order on a glass plate 23, and the resulting stack is set in a vacuum laminator apparatus. After degassing in vacuum, the stack is heated and cured to be sealed, whereby the photovoltaic module 21 of second embodiment is completed.

SECOND COMPARATIVE EMBODIMENT

Next, a photovoltaic module (not shown) of second comparative embodiment is produced in the same manner as in second embodiment by employing photovoltaic cells of first comparative embodiment for comparison with the photovoltaic module of second embodiment.

When the photo-electric conversion efficiencies of the photovoltaic module 21 of second embodiment and the photovoltaic module of second comparative embodiment are measured under the same conditions, the photovoltaic module of second embodiment has a photo-electric conversion efficiency of about 15.7%, and the photovoltaic module of second comparative embodiment has a photo-electric conversion efficiency of about 13.2%.

The acceptable product ratio of the photovoltaic module 21 of second embodiment is high (not lower than 96%) because the warpage of each of the photovoltaic cells is not greater than about 2 mm. On the other hand, the acceptable product ratio of the photovoltaic module of second comparative embodiment is relatively low (about 84%) with a higher breakage ratio of the photovoltaic cells because the warpage of each of the photovoltaic cells is about 4 mm.

It should be understood that the embodiments and the examples herein disclosed are illustrative but not limitative of the present invention in every aspect. The scope of the present invention is not defined by the foregoing description but by the claims, and intended to embrace every modification made within the scope and the equivalents of the present invention.

Although the light receiving surface electrode 3 is provided on the front surface of the photovoltaic cell 1 in first and second embodiments, the reflection film 4, 24 is applicable to a photovoltaic cell which includes a $p^+$ side electrode (rear electrode 5) and an $n^+$ side electrode (light receiving surface electrode 3) provided on a rear surface of a photo-electric conversion layer 2 thereof.

In second embodiment, the reflection film 4 is bonded to each of the photovoltaic cells 1. According to another embodiment, the module may be produced by electrically connecting the photovoltaic cells 1 each uncovered with the reflection film 4 by the connection members 22 and then covering all the rear surfaces of the photovoltaic cells 1 with a single reflection film having an area substantially equal to the light receiving area of the photovoltaic module 21.

In this case, the step of cutting the reflection film 4 according to the size of the photo-electric conversion layer 2 and the step of positioning the reflection film 4 on the photo-electric conversion layer 2 can be obviated. Where the reflection film having substantially the same size as the photovoltaic module 21 is employed, the aforesaid resin sheet 25 of EVA and the rear surface protection sheet 26 may be employed as the reflection film front face protection layer and the rear surface protection film, respectively.

Where this reflection film is employed, the rear surface of the photovoltaic module is defined by the reflection film alone. In this case, the time required for the degassing for improvement of adhesion between the photovoltaic cells 1, the reflection film 4, the resin sheet 25 and the rear surface protection sheet 26 can be reduced in second embodiment, thereby improving the productivity of the photovoltaic module.

The example embodiments have the following industrial applicability.
(1) Higher photo-electric conversion efficiency can be provided even if the thin silicon substrate is employed as the photo-electric conversion layer.
(2) Production costs can be reduced by employing the thin silicon substrate as the photo-electric conversion layer.

What is claimed is:
1. A photovoltaic cell, comprising:
a photo-electric conversion layer having a front surface and a rear surface; and
a reflection layer provided on the rear surface of the photo-electric conversion layer,
wherein the reflection layer includes transparent layers of a first material having a refractive index substantially ranging from 1.45 to 1.65 and of a second material having a refractive index substantially ranging from 1.70 to 1.90 which are alternately stacked in a total number substantially ranging between 50 and 500, each of the transparent layers having a thickness substantially ranging between 50 nm and 160 nm,
wherein the transparent layers are formed from an organic polymer material, and
wherein the reflection layer has a reflectivity of 95% or higher for light wavelengths substantially ranging between 400 nm and 1100 nm, so that when light is incident from the front surface of the photo-electric conversion layer, the reflection layer reflects a part of the incident light having wavelengths substantially ranging between 400 and 1100 nm back into the photo-electric conversion layer.

2. The photovoltaic cell as set forth in claim 1, wherein the photo-electric conversion layer includes a rear electrode locally provided on the rear surface thereof.

3. The photovoltaic cell as set forth in claim 1, wherein the photo-electric conversion layer includes a rear electrode locally provided on the rear surface thereof and an area ratio of the rear electrode to the rear surface of the photo-electric conversion layer substantially ranges from 1% to 20%.

4. The photovoltaic cell as set forth in claim 1, wherein the photo-electric conversion layer comprises a silicon substrate including a pn junction layer and having a thickness substantially ranging from 100 μm to 250 μm.

5. The photovoltaic module, comprising:
a plurality of photovoltaic cells two-dimensionally arranged; and
a connection member which connects each two adjacent photovoltaic cells in series,
wherein the photovoltaic cells each comprise a photovoltaic cell as recited in claim 1.

6. A photovoltaic module, comprising:
a photo-electric conversion layer;
a rear electrode locally provided on a rear surface of the photo-electric conversion layer; and
a reflection layer covering the rear surface of the photo-electric conversion layer and the rear electrode, wherein the reflection layer includes transparent layers of a first material having a refractive index substantially ranging from 1.45 to 1.65 and of a second material having a refractive index substantially ranging from 1.70 to 1.90 which are alternately stacked in a total number substantially ranging between 50 and 500, each of the transparent layers having a thickness substantially ranging between 50 nm and 160 nm, wherein the transparent layers are formed from an organic polymer material, and wherein the reflection layer has a reflectivity of 95% or higher for light wavelengths substantially ranging between 400 nm and 1100 nm, so that when light is incident from the front surface of the photo-electric conversion layer, the reflection layer reflects a part of the incident light having wavelengths substantially ranging between 400 nm and 1100 nm back into the photo-electric conversion layer.

7. The photovoltaic module as set forth in claim 6, wherein an area ratio of the rear electrode to the rear surface of the photo-electric conversion layer substantially ranges from 1% to 20%.

8. The photovoltaic module as set forth in claim 6, wherein the photo-electric conversion layer comprises a silicon substrate including a pn junction layer and having a thickness substantially ranging from 100 μm to 250 μm.

9. The photovoltaic cell as set forth in claim 1, wherein a difference in the refractive indices between adjacent transparent layers substantially ranges between 0.25 and 0.45.

10. The photovoltaic cell as set forth in claim 2, wherein the rear electrode is formed of an electrically conductive transparent material.

11. The photovoltaic cell as set forth in claim 1, wherein a size of the photovoltaic cell is substantially 15 cm×15 cm and a warpage of the photovoltaic cell is substantially 2 mm or less.

12. The photovoltaic module as set forth in claim 6, wherein a difference in the refractive indices between adjacent transparent layers substantially ranges between 0.25 and 0.45.

13. The photovoltaic module as set forth in claim 6, wherein the rear electrode is formed of an electrically conductive transparent material.

* * * * *